(12) United States Patent
Nakamura

(10) Patent No.: US 9,508,489 B2
(45) Date of Patent: Nov. 29, 2016

(54) CAPACITOR HOLDER

(71) Applicant: Kitagawa Industries Co., Ltd., Inazawa-shi, Aichi (JP)

(72) Inventor: Tatsuya Nakamura, Inazawa (JP)

(73) Assignee: Kitagawa Industries Co., Ltd., Aichi (JP)

( * ) Notice: Subject to any disclaimer, the term of this patent is extended or adjusted under 35 U.S.C. 154(b) by 84 days.

(21) Appl. No.: 14/442,314

(22) PCT Filed: Nov. 11, 2013

(86) PCT No.: PCT/JP2013/080438
§ 371 (c)(1),
(2) Date: May 12, 2015

(87) PCT Pub. No.: WO2014/073681
PCT Pub. Date: May 15, 2014

(65) Prior Publication Data
US 2016/0284470 A1 Sep. 29, 2016

(30) Foreign Application Priority Data
Nov. 12, 2012 (JP) .................................. 2012-248605

(51) Int. Cl.
 *H01G 4/00* (2006.01)
 *H01G 2/10* (2006.01)
 *H01G 2/06* (2006.01)

(52) U.S. Cl.
 CPC ............... *H01G 2/106* (2013.01); *H01G 2/06* (2013.01); *H05K 2201/10628* (2013.01)

(58) Field of Classification Search
 CPC ................... H01G 2/106; H01G 2/06; H05K 2201/10628

USPC ............................................... 361/301.3, 535
See application file for complete search history.

(56) References Cited

U.S. PATENT DOCUMENTS 5,921,820 A * 7/1999 Dijkstra .................. H01G 2/06
361/520
6,323,440 B1 * 11/2001 Maruyama ............. H05K 3/301
174/260

(Continued)

FOREIGN PATENT DOCUMENTS

DE 102006012402 A1 5/2007
JP H0317663 U 2/1991

(Continued)

OTHER PUBLICATIONS

English translation of International Search Report for PCT/JP2013/080438 dated Nov. 28, 2013.

(Continued)

*Primary Examiner* — Sherman Ng
(74) *Attorney, Agent, or Firm* — Kinney & Lange, P.A.

(57) ABSTRACT

A capacitor holder includes: a cylindrical portion made of a resin having a cylindrical shape and externally fitted to a capacitor; a pair of protrusions formed integrally with the cylindrical portion, the protrusions protruding in an outward direction of the cylindrical portion from positions opposed to each other with respect to an axis of the cylindrical portion; and a pair of metal pins protruding along the axis from axial end surfaces of the paired protrusions, the metal pins configured to solder the cylindrical portion and the protrusions to a printed circuit board. In the capacitor holder, a distance between the axis and outer circumferences of the protrusions is less than 0.76 times of an inner diameter of the cylindrical portion.

4 Claims, 3 Drawing Sheets

(56) References Cited

U.S. PATENT DOCUMENTS

| | | |
|---|---|---|
| 7,532,484 B1 | 5/2009 | Sailor et al. |
| 2004/0094688 A1 | 5/2004 | Michel et al. |
| 2004/0136170 A1* | 7/2004 | Tsunezaki ............... H01G 2/04 361/810 |
| 2009/0002942 A1* | 1/2009 | Seifert ................... H01G 2/04 361/694 |
| 2013/0140079 A1* | 6/2013 | Nakamura ............... H01G 2/06 174/551 |

FOREIGN PATENT DOCUMENTS

| | | |
|---|---|---|
| JP | H04256287 A | 10/1992 |
| JP | H09260181 A | 10/1997 |
| JP | H11283868 A | 10/1999 |
| JP | 2000269081 A | 9/2000 |
| JP | 2003530532 A | 10/2003 |
| JP | 2011187627 A | 9/2011 |

OTHER PUBLICATIONS

English Translation of Written Opinion dated Oct. 12, 2013, for PCT/JP2013/080438.

English Translation of Written Opinion of the International Searching Authority dated Dec. 10, 2013 for PCT/JP2013/080438.

English Translation of the International Preliminary Report on Patentability dated May 12, 2015 for PCT/JP2013/080438.

Supplementary European Search Report mailed Jul. 8, 2016, for corresponding European Application No. 13852402.0.

* cited by examiner

CAPACITOR HOLDER

CROSS-REFERENCE TO RELATED APPLICATION

This international application claims the priority of the Japanese Patent Application No. 2012-248605 filed in Japan Patent Office on Nov. 12, 2012. The entire disclosure of the Japanese Patent Application No. 2012-248605 shall be incorporated into this international application by this reference.

TECHNICAL FIELD

This invention relates to a capacitor holder configured to hold a capacitor on a printed circuit board. More particularly, this invention relates to a capacitor holder configured to hold a columnar capacitor to make the axis of the capacitor perpendicular to a printed circuit board.

BACKGROUND ART

One example of such a kind of the capacitor holder thus-far proposed includes a cylindrical portion and legs. The cylindrical portion is formed in a cylindrical shape and externally fitted to a capacitor. The legs are respectively disposed at positions opposed to each other with respect to the axis of the cylindrical portion. The legs fix the cylindrical portion the printed circuit board (see, for example, Patent Literature 1).

CITATION LIST

Patent Literature

PATENT LITERATURE 1: Unexamined Japanese patent application publication No. 11-283868

SUMMARY OF INVENTION

Problems to be Solved by the Invention

When the capacitor holder is mounted on the printed circuit board using a so-called snap made of a resin as disclosed in Patent Literature 1, the snap may be melted during a subsequent soldering step using a flow solder tank or the like. In addition, when the solder adheres to the snap during the soldering step, the solder may unexpectedly fall on a conduction portion of another circuit, and may cause a short circuit. Therefore, mounting such a capacitor holder on the printed circuit board should be preferably performed while preventing the above problem from occurring even using soldering from the back side of the printed circuit board. Instead of the resin snap, for example, a metal pin for use in soldering preferably protrudes from the outer circumference of the capacitor holder along the axis of the cylindrical portion.

When the metal pin fixable by soldering is provided to the capacitor holder, the resin cylindrical portion is preferably provided with a pair of protrusions configured to fix the metal pins, and the protrusions preferably protrude in the outward direction of the cylindrical portion from the positions respectively opposed to each other with respect to the axis of the cylindrical portion. With this arrangement, the protrusions are provided with the metal pins so that the metal pins protrude along the axis from axial end surfaces of such protrusions.

However, when the protrusions are provided to the outer circumference of the cylindrical portion, the protrusions may interfere with each other, and may hinder the layout in which the capacitor holders are densely located. Thus, a number of capacitors can be hardly mounted on a limited area on the printed circuit board. An aspect of the invention preferably suppresses a decrease in packing density of the capacitors, even when a metal pin soldered to a printed circuit board is employed in a capacitor holder configured to hold a columnar capacitor such that the axis of the capacitor is perpendicular to the printed circuit board.

Solutions to the Problems

A capacitor holder according to a first aspect of the invention includes: a cylindrical portion made of a resin having a cylindrical shape and externally fitted to a capacitor; a pair of protrusions formed integrally with the cylindrical portion, the protrusions protruding from positions opposed to each other with respect to an axis of the cylindrical portion in an outward direction of the cylindrical portion; and a pair of metal pins protruding along the axis from axial end surfaces of the protrusions, the metal pins configured to solder the cylindrical portion and the protrusions to a printed circuit board. In the capacitor holder, a distance between the axis and outer circumferences of the protrusions is less than 0.76 times of an inner diameter of the cylindrical portion.

In the above-configured capacitor holder according to the first aspect of the invention, the cylindrical portion and the paired protrusions are integrally formed of a resin. The cylindrical portion in cylindrical shape is externally fitted to the capacitor. The paired protrusions support the metal pins for use in soldering the capacitor holder. Further, the paired protrusions protrude in the outward direction of the cylindrical portion, from the positions opposed to each other with respect to the axis of the cylindrical portion, by the protruding amount set within the following range. That is, the distance between the axis and the outer circumferences of the protrusions is less than 0.76 times of the inner diameter of the cylindrical portion.

When the protruding amount of the protrusions is too great, the protrusions may interfere with each other, and the capacitor holders may not be disposed so densely that the cylindrical portions thereof are in contact with each other. Therefore, the applicant has had a number of experiments with various shapes and various protruding amounts of the protrusions. As the result, the applicant has found that, by setting the protruding amount of the protrusions within the above range, the metal pins are stably supported and the capacitor holders are disposed as densely as described above. According to the first aspect of the invention, the distance between the axis and the outer circumferences of the protrusions is less than 0.76 times of the inner diameter of the cylindrical portion. Therefore, in the first aspect of the invention, the capacitor holders may be favorably soldered to the printed circuit board via the metal pins without a decrease in packing density of the capacitors. In addition, the capacitor holder according to the first aspect of the invention is mounted to the printed circuit board via the metal pins by soldering. With this arrangement, unlike a configuration where a snap made of a resin is used to mount the capacitor holder, the snap is suppressed from being melted during the soldering step, and the solder having adhered to the snap is suppressed from falling on other circuits. In addition, according to the first aspect of the invention, the soldering of the capacitor and the soldering of the capacitor holder are performable at the same time.

In the first aspect of the invention, the protruding amount of the protrusions is not subject to any particular lower limits. However, when the cylindrical portion is so thick that the metal pins are supportable, the packing density of the capacitors is not increased even if the cylindrical portions are in contact with each other. Therefore, the protrusions preferably more or less protrude from the outer circumference of the cylindrical portion.

According to a second aspect of the invention, the capacitor holder according to the first aspect of the invention may further include a flat portion whose outer surface is a flat surface extending perpendicularly to a radial direction of the cylindrical portion, the flat portion positioned on an outer circumference of the cylindrical portion at a position not to overlap with the protrusions. The above arrangement provides the following various advantageous effects. Specifically, first, by mounting the capacitor holders such that the flat portions thereof are in abutment with each other, the capacitor holders support each other and suppress the rotation each other. In addition, when the capacitors are disposed along a casing or sheet metal, the mounting of the capacitors is facilitated by abutting the flat portions on the casing or the sheet metal. Further, when the capacitor holder is mounted on the sheet metal by pressing, the guiding is facilitated by abutting the flat portions on the sheet metal.

According to a third aspect of the invention, in the capacitor holder according to the second aspect of the invention, the flat portion may include a pair of flat portions positioned respectively at positions rotatably displaced around the axis by 90 degrees from the positions where the pair of protrusions is provided. In the above configuration, the alignment direction of the metal pins is parallel to the flat outer surface of the flat portion. Therefore, when the two metal pins are not sufficient for supporting the capacitor and the capacitor holder, the supporting strength may be supplemented by bringing the flat portions into surface contact with the sheet metal, the casing or the flat portions of another capacitor holder. Further, the capacitor holders may be aligned to form a plurality of lines such that the flat portions are in contact with each other in each line. The plurality of lines may be layered in a direction perpendicular to the direction in which each line extends, while each line is displaced from the neighboring lines by the half amount of the capacitor holder. With the above configuration, the packing density of the capacitors is increased in a highly facilitated manner.

According to a fourth aspect of the invention, the capacitor holder according to any one of the first to third aspects of the invention may further include a bottom having a lead hole through which a lead of the capacitor penetrates, the bottom formed integrally with the cylindrical portion and positioned at an end surface of the cylindrical portion facing a direction in which the metal pins protrude. In the above configuration, the resin bottom is disposed between the capacitor inserted into inner side of the cylindrical portion and the printed circuit board. Thus, the capacitor and the printed circuit board are favorably insulated from each other.

In the description that follows, the exemplary embodiments respectively according to the first to fourth aspects of the invention will be described.

DESCRIPTION OF REFERENCE SIGNS

1 . . . Capacitor holder
3 . . . Bottom
3A . . . Lead hole
5 . . . Cylindrical portion
5A . . . Flat portion
5B . . . Protrusion
7 . . . Metal pin

DESCRIPTION OF EMBODIMENTS

Overall Configuration of Capacitor Holder

Figure 1A:
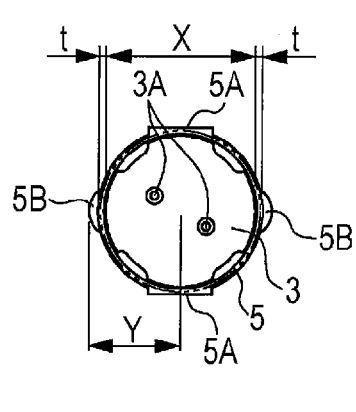
FIGS. 1A to 1F are views each illustrating a configuration of a capacitor holder to which the invention is applied.
Figure 1F:
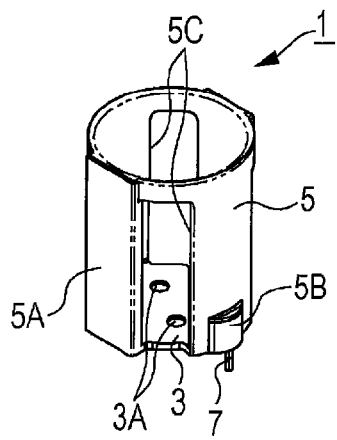
Figure 1D:
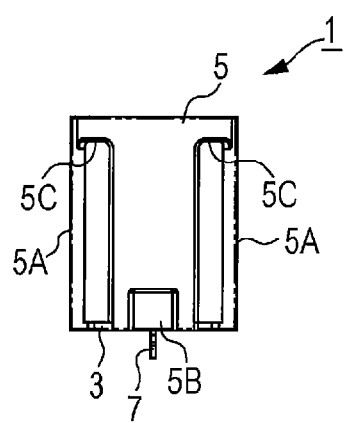
Figure 1B:
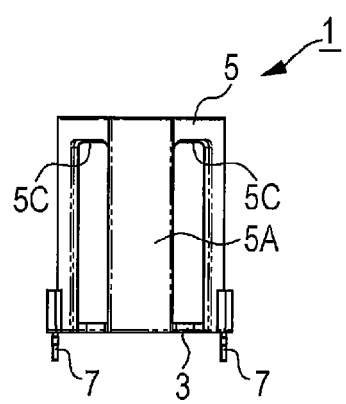
Figure 1E:
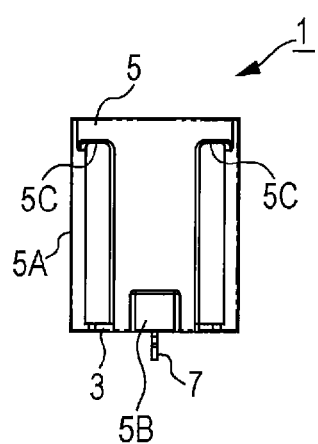
Figure 1C:
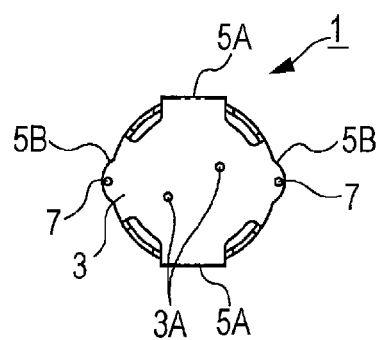

FIGS. 1A to 1F each depict a configuration of a capacitor holder 1 to which the invention is applied. FIG. 1A is a plan view, FIG. 1B is a front view, FIG. 1C is a bottom view, FIG. 1D is a left lateral view, FIG. 1E is a right lateral view, and FIG. 1F is a perspective view.

As depicted in FIGS. 1A to 1F, the capacitor holder 1 according to this embodiment has a bottomed cylindrical shape, according to which a substantially annular cylindrical portion 5 is erected from the outer circumference of a circular bottom 3. In addition, a pair of flat portions 5A is provided to the outer circumference of the cylindrical portion, and the flat portions 5A are positioned at positions opposed to each other by 180 degrees with respect to the axis of the cylindrical portion 5. Each flat portion 5A has an outer surface that is flat perpendicularly to the radial direction of the cylindrical portion 5. Further, a pair of protrusions 5B is provided to an end of the cylindrical portion 5 closer to the bottom 3, and the protrusions 5B are positioned at positions rotatably displaced around the axis by 90 degrees from the positions of the flat portions 5A. Each protrusion 5B protrudes from the surface of the cylindrical portion 5 to form an arc shape in a plan view. In addition, each protrusion 5B is shaped like a half-cut column, in which each cross section in parallel to the axis is rectangular. Further, metal pins 7 protrude along the axis from the end surfaces of the protrusions 5B closer to the bottom 3.

The cylindrical portion 5 (including the above-described flat portions 5A and protrusions 5B) and the bottom 3 are integrally formed of a resin such as polyamide (e.g., PA6, PA66), polybutylene terephthalate (PBT), polyphenylene sulfide (PPS) and liquid crystal polymer (LCP). The bottom 3 is provided with lead holes 3A through which the lead of the cylindrical capacitor (not depicted) inserted into the inner side of the cylindrical portion 5 penetrates. Clearances 5C are provided between the flat portions 5A and the protrusions 5B of the cylindrical portion 5 in order to radiate the heat of the capacitor and to save the resin material.

The capacitor holder 1 configured as described above will be used in the following manner. Specifically, the capacitor is inserted into the inner side of the cylindrical portion 5. The lead of the capacitor is taken out through the lead holes 3A to protrude therefrom. Then, the capacitor holder 1 is mounted to the printed circuit board via the metal pins 7 by soldering. The inner surface of the cylindrical portion 5 is provided with ribs although the ribs are not depicted in FIGS. 1A to 1F due to their small size. By pressing the ribs, the capacitor is inserted thereinto.

The capacitor holder 1 is mounted to the printed circuit board via the metal pins 7 by soldering. Therefore, even when the soldering is conducted from the back surface (i.e., the surface opposite to the surface where the capacitor is mounted) of the printed circuit board, unlike an arrangement where the so-called snap made of a resin is used, the snap is suppressed from being melted during the soldering step, and the solder having adhered to the snap is suppressed from falling on other circuits. In addition, when the metal pins 7 are used, the soldering of the capacitor and the soldering of the capacitor holder 1 are performable at the same time by conducting the soldering from the back surface of the printed circuit board as described above.

[Protruding Amount of Protrusions and its Effects]

Figure 2:
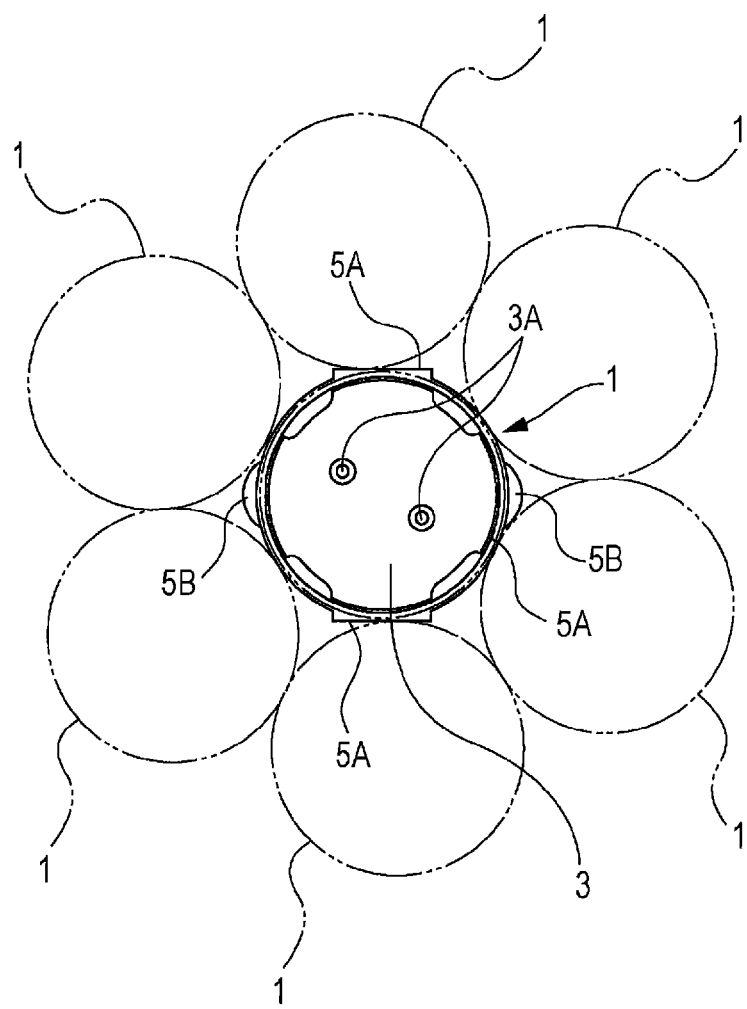
FIG. 2 is a plan view of the capacitor holders disposed in a dense state.

When the protruding amount of the protrusions 5B is excessively great, the capacitor holders 1 may not be disposed in such dense manner that the cylindrical portions 5 are in contact with each other as depicted in FIG. 2. Therefore, the applicant has had a number of experiments with various shapes and various protruding amounts of the protrusions 5B. As the result, the applicant has found that by controlling the protruding amount of the protrusions to be within a suitable range, the protrusions 5B may stably support the metal pins 7, and the capacitor holders 1 may be disposed so densely as described above. Table 1 below depicts the results of the experiments. As depicted in FIG. 1A, in Table 1, X represents an inner diameter of the cylindrical portion 5, and Y represents a distance between the outer circumference of the protrusions 5B and the axis. Also in Table 1, the "OK" assessment means that, even though the shape of the protrusions 5B was required to be slightly modified, the protrusions 5B were able to stably support the metal pins 7, and that the capacitor holders 1 were disposable in a dense manner as described above. On the other hand, the "NG" assessment means that the capacitor holders 1 were not disposable in such dense manner as described above.

TABLE 1

| X (mm) | Y (mm) | Y/X | Assessment |
|---|---|---|---|
| 18.5 | 13 | 0.702 | OK |
|  | 14 | 0.757 | OK |
|  | 15 | 0.811 | NG |
| 16.5 | 11 | 0.667 | OK |
|  | 12 | 0.727 | OK |
|  | 13 | 0.788 | NG |
| 13.0 | 8 | 0.615 | OK |
|  | 9 | 0.692 | OK |
|  | 10 | 0.769 | NG |
| 10.5 | 6 | 0.571 | OK |
|  | 7 | 0.667 | OK |
|  | 8 | 0.762 | NG |

As is evident from Table 1, it is found that Y/X<0.76 for at least a frequently used capacitor of 10.5 to 18.5 (mm) in diameter allows the capacitor holder 1 to be appropriately soldered to the printed circuit board via the metal pins 7 without a decrease in packing density of the capacitors. The useful metal pins 7 may be those of 0.3 mm in minimum diameter. In order to stably support the metal pins 7, the metal pins 7 have required to be surrounded by the resin having a thickness of 0.5 mm or more.

When the thickness t (see FIG. 1A) of the cylindrical portion 5 is sufficiently great, the protrusions 5B are not required, and the metal pins 7 may protrude directly from the cylindrical portion 5. However, when the cylindrical portion 5 is thick, the packing density of the capacitors is not increased so much even if the cylindrical portions 5 are in contact with each other. Therefore, the protrusions 5B preferably more or less protrude from the outer circumference of the cylindrical portion 5. In this example, t is equal to 0.8 mm.

Further, the capacitor holder 1 according to this embodiment is provided with the pair of flat portions 5A, and thus provides the following various advantageous effects. Specifically, first of all, by mounting the capacitor holders 1 such that the flat portions 5A thereof are in abutment with each other, the capacitor holders 1 support each other and suppress the rotation each other. In addition, when the capacitors are disposed along a casing or sheet metal, the mounting of the capacitors is facilitated by abutting the flat portions 5A on the casing or the sheet metal. Moreover, when the mounting is conducted while the capacitors are pressed to the sheet metal, the guiding is facilitated by abutting the flat portions 5A on the sheet metal.

Figure 3:
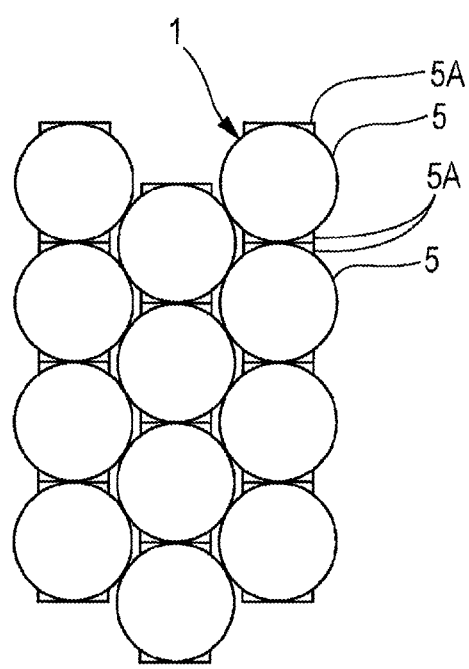
FIG. 3 is a schematic view illustrating the capacitor holders disposed in a dense state.

The advantageous effects as described above are obtainable as long as the flat portions 5A are provided on the outer circumference of the cylindrical portion 5 at positions not to overlap with the protrusions 5B. Further, according to this embodiment, the paired flat portions 5A each are provided at the positions rotatably displaced around the axis by 90 degrees from the positions of the protrusions 5B. Therefore, the alignment direction of the metal pins 7 is parallel to the outer flat surface of the flat portions 5A. Hence, the following advantageous effects are also obtainable. Specifically, when the two metal pins 7 are not sufficient for supporting the capacitor and the capacitor holder 1, the supporting strength may be supplemented by bringing the flat portions 5A into surface contact with the sheet metal, the casing or the flat portions 5A of another capacitor holder 1. Further as depicted in FIG. 3, the capacitor holders 1 may be aligned to form a plurality of lines such that the flat portions 5A are in contact with each other in each line. The plurality of lines may be layered in a direction perpendicular to the direction in which each line extends, while each line is displaced from the neighboring lines by the half amount of the capacitor holder 1. With the above configuration, the packing density of the capacitors is increased in a highly facilitated manner. For the convenience of description, FIG. 3 does not depict the protrusions 5B, and depicts the flat portions 5A in a slightly enlarged manner.

The invention is not limited at all to the embodiments as described above. The invention may be variously modified as long as such modification does not depart from the gist of the invention. For example, the protrusions 5B may not have arc shapes in the plan view, but may be triangular or quadrangular in the plan view. However, in light of securing the area on the end surface where the metal pins 7 are provided, as well as in light of suppressing the protruding amount from the outer circumference of the cylindrical portion 5, the protrusions 5B preferably have arc shapes or ellipse shapes in the plan view.

The bottom 3 is not necessarily provided. However, when the bottom 3 is formed integrally with the cylindrical portion 5, the resin bottom 3 interposes between the capacitor inserted into the inner side of the cylindrical portion 5 and the printed circuit board. Thus, the bottom 3 favorably insulates the capacitor and the printed circuit board from each other. In addition, a single flat portion 5A may be used, or alternatively, the flat portion 5A may be omitted.

The invention claimed is:

1. A capacitor holder, comprising:
   a cylindrical portion made of a resin having a cylindrical shape and externally fitted to a capacitor;

a pair of protrusions formed integrally with the cylindrical portion, the protrusions protruding from positions opposed to each other with respect to an axis of the cylindrical portion in an outward direction of the cylindrical portion; and a pair of metal pins protruding along the axis from axial end surfaces of the protrusions, the metal pins configured to solder the cylindrical portion and the protrusions to a printed circuit board, wherein a distance between the axis and outer circumferences of the protrusions is less than 0.76 times of an inner diameter of the cylindrical portion.

2. The capacitor holder according to claim 1, further comprising a flat portion whose outer surface is a flat surface extending perpendicularly to a radial direction of the cylindrical portion, the flat portion positioned on an outer circumference of the cylindrical portion at a position not to overlap with the protrusions.

3. The capacitor holder according to claim 2, wherein the flat portion includes a pair of flat portions positioned respectively at positions rotatably displaced around the axis by 90 degrees from the positions where the pair of protrusions is provided.

4. The capacitor holder according to claim 1, further comprising a bottom having a lead hole through which a lead of the capacitor penetrates, the bottom formed integrally with the cylindrical portion and positioned at an end surface of the cylindrical portion facing a direction in which the metal pins protrude.

* * * * *